(12) United States Patent
Lee et al.

(10) Patent No.: US 11,204,837 B2
(45) Date of Patent: Dec. 21, 2021

(54) ELECTRONIC SYSTEMS, FAULT DETECTING METHODS THEREOF, SYSTEM ON CHIPS, AND BUS SYSTEMS

(71) Applicant: Samsung Electronics Co., Ltd., Suwon-si (KR)

(72) Inventors: Cheonsu Lee, Hwaseong-si (KR); Rohitaswa Bhattacharya, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/939,310

(22) Filed: Jul. 27, 2020

(65) Prior Publication Data
US 2021/0149765 A1    May 20, 2021

(30) Foreign Application Priority Data
Nov. 14, 2019    (KR) .................... 10-2019-0146178

(51) Int. Cl.
    *G06F 11/10*    (2006.01)
    *G06F 13/16*    (2006.01)
(52) U.S. Cl.
    CPC ...... *G06F 11/1076* (2013.01); *G06F 13/1668* (2013.01)
(58) Field of Classification Search
    CPC ................. G06F 11/1076; G06F 13/1668
    See application file for complete search history.

(56) References Cited

U.S. PATENT DOCUMENTS

| | | | |
|---|---|---|---|
| 7,370,232 B2 | 5/2008 | Safford | |
| 7,496,786 B2 | 2/2009 | Graham et al. | |
| 8,181,064 B2 | 5/2012 | Owaki et al. | |
| 9,052,887 B2 | 6/2015 | Rohleder et al. | |
| 9,118,351 B2 | 8/2015 | Vilela et al. | |
| 9,576,137 B2 | 2/2017 | Habel et al. | |
| 9,983,930 B2 | 5/2018 | Quach et al. | |
| 10,298,271 B2 | 5/2019 | Hammerschmidt et al. | |

(Continued)

OTHER PUBLICATIONS

A. Nardi and A. Armato, "Functional safety methodologies for automotive applications," 2017 IEEE/ACM International Conference on Computer-Aided Design (ICCAD), Irvine, CA, 2017, pp. 970-975, doi: 10.1109/ICCAD.2017.8203886.

(Continued)

*Primary Examiner* — Kyle Vallecillo
(74) *Attorney, Agent, or Firm* — Harness, Dickey & Pierce, P.L.C.

(57) ABSTRACT

An electronic system may include one or more units of processing circuitry configured to implement a main intellectual property (IP), a checker IP, and an error detection circuit. The main IP includes a first data path and a first control signal path. The checker IP includes a second control signal path. The error detection circuit is configured to detect an error of data by performing error correction code (ECC) decoding of output data that is output by the main IP to the error detection circuit through the first data path, and detect an error of a control signal based on a first signal that is output by the main IP to the error detection circuit through the first control signal path, and a second signal that is output by the checker IP to the error detection circuit through the second control signal path.

20 Claims, 10 Drawing Sheets

(56) References Cited

U.S. PATENT DOCUMENTS

| | | | |
|---|---|---|---|
| 2004/0223386 A1* | 11/2004 | Mudge | G06F 1/3287 |
| | | | 365/202 |
| 2005/0022094 A1* | 1/2005 | Mudge | G06F 9/3861 |
| | | | 714/758 |
| 2006/0018171 A1* | 1/2006 | Austin | G06F 9/3861 |
| | | | 365/205 |
| 2006/0280002 A1* | 12/2006 | Bull | G11C 7/1006 |
| | | | 365/189.07 |
| 2010/0058107 A1* | 3/2010 | Blaauw | G06F 11/1695 |
| | | | 714/2 |
| 2011/0107166 A1* | 5/2011 | Flautner | G06F 11/0736 |
| | | | 714/746 |
| 2013/0212441 A1 | 8/2013 | Vilela et al. | |
| 2014/0075262 A1* | 3/2014 | Kitasho | G06F 11/1048 |
| | | | 714/755 |
| 2015/0254129 A1* | 9/2015 | Authement | G11C 29/52 |
| | | | 714/704 |
| 2017/0371745 A1* | 12/2017 | Lee | G11C 7/1006 |
| 2018/0006716 A1* | 1/2018 | Hyakudai | H04B 10/07 |
| 2018/0105183 A1 | 4/2018 | Kollmer | |
| 2019/0039644 A1 | 2/2019 | Bernon-Enjalbert et al. | |
| 2019/0094830 A1 | 3/2019 | Nishikawa et al. | |
| 2019/0121359 A1 | 4/2019 | Dobberphul et al. | |

OTHER PUBLICATIONS

Baleani, M. et al., "Fault-Tolerant Platforms for Automotive Safety-Critical Applications", https://www.researchgate.net/publication/221147911, Jan. 2003.

* cited by examiner

ELECTRONIC SYSTEMS, FAULT DETECTING METHODS THEREOF, SYSTEM ON CHIPS, AND BUS SYSTEMS

CROSS-REFERENCE TO RELATED APPLICATION

This application claims the benefit of Korean Patent Application No. 10-2019-0146178, filed on Nov. 14, 2019, in the Korean Intellectual Property Office, the disclosure of which is incorporated herein in its entirety by reference.

BACKGROUND

The inventive concepts relate to electronic systems, methods of detecting faults thereof, systems-on-chips, and bus systems, and more particularly, relate to electronic systems for detecting faults including errors of data and various signals, systems-on-chips, bus systems, and methods of detecting faults thereof.

Semiconductor devices, including system-on-chips (SoCs) and the like, have been used in various industrial fields. When semiconductor devices are used in various industrial fields, errors may occur in data and/or signals to be processed in the semiconductor devices due to various reasons.

SUMMARY

The inventive concepts provide methods and apparatuses for performing reliable fault detection and reducing area and/or cost in chip or system implementation in electronic systems, methods of detecting faults thereof, system-on-chips (SoCs) and bus systems. In some example embodiments, where such electronic systems, SoCs and/or bus systems are used in various industrial fields, such fault detection performed in associated with such electronic systems, SoCs and/or bus systems may reduce or prevent the occurrence of control errors.

According to some example embodiments of the inventive concepts, an electronic system may include a main intellectual property (IP) including a first data path and a first control signal path, a checker IP including a second control signal path, and an error detection circuit configured to detect an error of data by performing error correction code (ECC) decoding of output data that is output by the main IP to the error detection circuit through the first data path, and detect an error of a control signal based on a first signal that is output by the main IP to the error detection circuit through the first control signal path, and a second signal that is output by the checker IP to the error detection circuit through the second control signal path.

According to some example embodiments of the inventive concepts, a method of detecting a fault of an electronic system, the electronic system including a first intellectual property (IP) and a second IP, may include detecting an error of input data by performing error correction code (ECC) decoding of output data that is output from a first data path of the first IP, and detecting an error of a control signal based on a first signal that is output from a first control signal path of the first IP and a second signal that is output from a second control signal path of the second IP.

According to some example embodiments of the inventive concepts, a system-on-chip may include an error correction code (ECC) encoder configured to generate encoded data by performing ECC encoding of input data, a main intellectual property (IP) configured to receive the encoded data and a first control signal and to output an output data through a first data path based on the encoded data and to output a second control signal through a first control signal path based on the first control signal, a first delay circuit configured to generate a third control signal by delaying the first control signal by a particular clock cycle, a checker IP configured to output a fourth control signal through a second control signal path based on the third control signal, an ECC decoder configured to output a data error detection signal by performing ECC decoding of the output data, a second delay circuit configured to generate a fifth control signal by delaying the second control signal by the particular clock cycle, and a checker circuit configured to detect an error of a control signal by comparing the fourth control signal to the fifth control signal.

According to some example embodiments of the inventive concepts, a bus system may include a first intellectual property (IP) configured to output data and a first control signal, a second IP configured to output a second control signal, an error correction code (ECC) decoder configured to output a data error detection signal by performing ECC decoding of the output data, a delay circuit configured to generate a third control signal by delaying the first control signal by a particular clock cycle, and a checker circuit configured to detect an error of a control signal by comparing the second control signal to the third control signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, some example embodiments of the inventive concepts will be described in detail.

Figure 1:
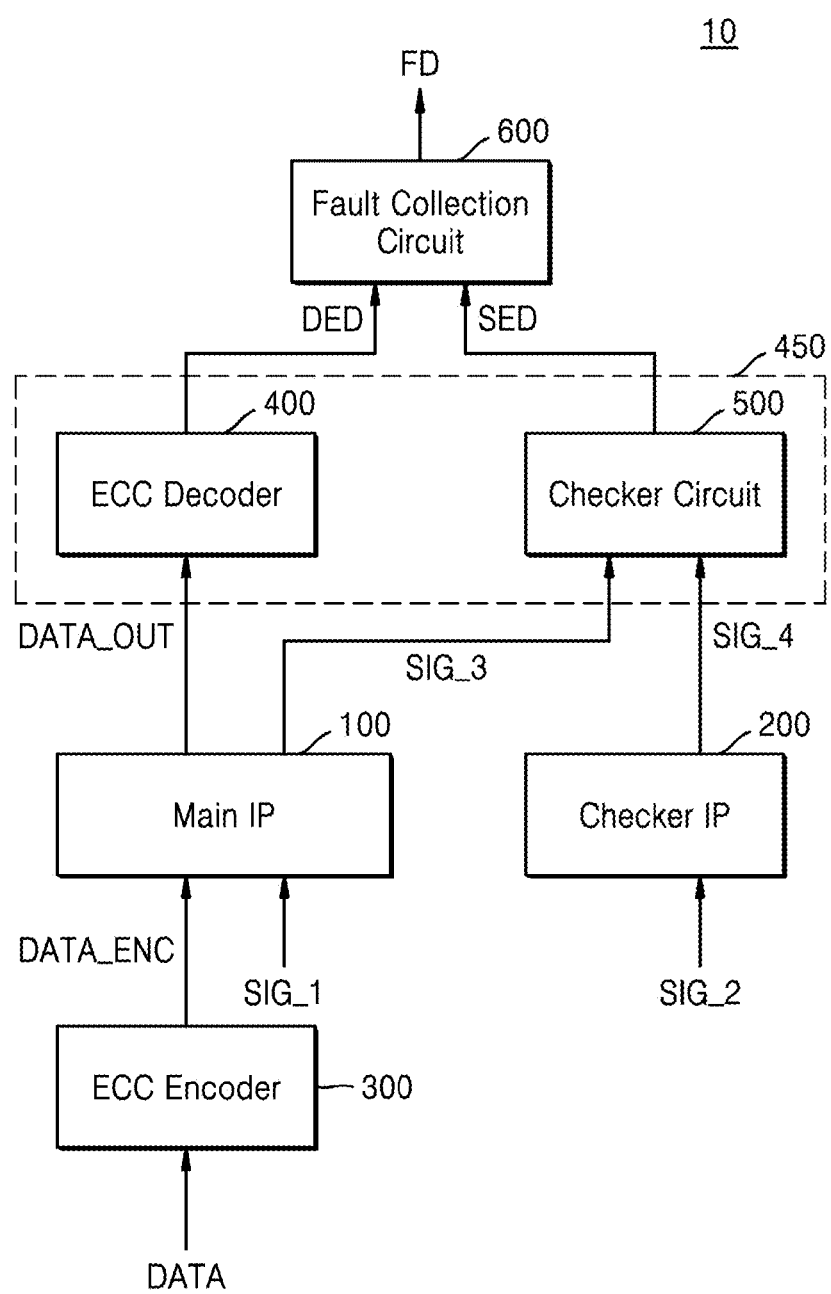
FIG. 1 illustrates an electronic system according to some example embodiments of the inventive concepts.

FIG. 1 illustrates an electronic system 10 according to some example embodiments of the inventive concepts. The electronic system 10 may include a main IP 100 (also referred to interchangeably herein as a first IP), a checker IP 200 (also referred to interchangeably herein as a second IP), an ECC encoder 300, an error detection circuit 450, and a fault collection circuit 600, and the error detection circuit 450 may include an ECC decoder 400 and a checker circuit 500. It will be understood that the electronic system 10 in some example embodiments may not include all of the main IP 100, the checker IP 200, the ECC encoder 300, the fault collection circuit 600, and the error detection circuit 450.

The electronic system 10 may be implemented in various forms. For example, the electronic system 10 may be implemented in the form of integrated circuits or various chips.

In some example embodiments, the electronic system 10 may be implemented in the form of (e.g., may be implemented by) a system-on-chip (SoC). The electronic system 10 may be applied to (e.g., may be included in) a robotic device such as a drone and an advanced driver assistance system (ADAS), a smart TV, a smart phone, a medical device, a mobile device, an image display device, a measurement device, an internet of things (IoT), or the like. In addition, the electronic system 10 may be mounted on one of various kinds of electronic devices. In some example embodiments, the electronic system 10 may include components that operate in a one-clock domain. For example, all of the main IP 100, the checker IP 200, and the error detection circuit 450 may be circuits configured to operate in a one-clock domain.

In some example embodiments, at least some of the main IP 100, the checker IP 200, the ECC encoder 300, the ECC decoder 400, the checker circuit 500 and the fault collection circuit 600 may be implemented as (e.g., may be implemented by) one or more digital circuits, which may include one or more instances of processing circuitry as described herein. That is, all of the main IP 100, the checker IP 200, the ECC encoder 300, the ECC decoder 400, the checker circuit 500, and the fault collection circuit 600 may be implemented as digital circuits, or only a part of the main IP 100, the checker IP 200, the ECC encoder 300, the ECC decoder 400, the checker circuit 500, and the fault collection circuit 600 may be implemented as digital circuits. However, the inventive concepts are not limited thereto, and all of the main IP 100, the checker IP 200, the ECC encoder 300, the ECC decoder 400, the checker circuit 500, and the fault collection circuit 600 may be implemented as analog circuits.

The main IP 100 may include one of various intellectual properties (IPs). For example, the main IP 100 may include a processing unit, a plurality of cores included in the processing unit, a multi-format codec (MFC), a video module (e.g., a camera interface, a joint photographic experts Group (JPEG) processor, a video processor, or a mixer), a 3D graphic core, an audio system, a driver, a display driver, a volatile memory, a non-volatile memory, a memory controller, an input and output interface block, or a cache memory, or the like. In addition, in some example embodiments, the main IP 100 may include a system bus.

In some example embodiments, the main IP 100 may transfer or process data and/or signals. For example, the main IP 100 may transfer encoded data DATA_ENC to be input from the ECC encoder 300 as output data DATA_OUT, or the main IP 100 may output the output data DATA_OUT by processing the encoded data DATA_ENC. In addition, for example, the main IP 100 may transfer a first signal SIG_1 as a third signal SIG_3, or may output the third signal SIG_3 by processing the first signal SIG_1.

In some example embodiments, the main IP 100 may include a data path for transferring or processing data and a control signal path for transferring or processing signals. Here, the signals may include various signals, and may include, for example, at least one of control signals to be used to control various circuit components in the electronic system 10. In other words, in some example embodiments, the main IP 100 may output the output data DATA_OUT through the data path based on the encoded data DATA_ENC and may output the third signal SIG_3 through the control signal path based on the first signal SIG_1. This will be described in more detail with reference to FIG. 3. It will be further understood that, where paths are described herein as performing an operation and/or being configured to perform an operation (e.g., output a data or signal, for example based on another data or signal), the element that includes said path (e.g., main IP 100) will be understood to be configured to perform the operation, for example perform the operation via said path or based on said path (e.g., main IP 100 will be understood to be configured to output the third signal SIG_3, based on a first signal SIG_1 that is input to the main IP 100, via, or based on, the first control signal path 140).

The checker IP 200 may transfer or process a signal. For example, the checker IP 200 may transfer a second signal SIG_2 as a fourth signal SIG_4, or may output the fourth signal SIG_4 by processing the second signal SIG_2. In some example embodiments, the second signal SIG_2 may be the first signal SIG_1 or may be a signal generated based on the first signal SIG_1. For example, the second signal SIG_2 may be a signal generated by delaying the first signal SIG_1 by a particular (or, alternatively, predetermined) clock cycle.

In some example embodiments, the checker IP 200 may include a data path and a control signal path. The checker IP 200 may output the fourth signal SIG_4 through the control signal path based on the second signal SIG_2. This will be described in more detail with reference to FIG. 5.

In some example embodiments, at a stage of designing a system (or a circuit), the checker IP 200 may be designed based on the main IP 100. For example, the checker IP 200 may be designed based on a duplication of main IP 100. In some example embodiments, the control signal path of the checker IP 200 may be the same or substantially the same as the control signal path of the main IP 100. In some example embodiments, the control signal path of the checker IP 200 may include circuit elements which are the same or substantially the same as circuit elements included in the control signal path of the main IP 100. It will be understood that elements may be recited herein as being "the same" as other elements, and it will be further understood that elements recited herein as being "the same" as other elements may be "the same" or "substantially the same" as the other elements, where elements that are "substantially the same" as other elements will be understood to be the same as the other elements within manufacturing tolerances and/or material tolerances. Circuit elements that are the same or substantially the same as other circuit elements may be structurally the same or substantially the same, functionally the same or substantially the same, and/or compositionally the same or substantially the same. In addition, in some example embodiments, the data path of checker IP 200 may be designed by performing boundary optimization, after duplicating the data path of the main IP 100 and then tying all inputs to be input to the data path thereof (e.g., subsequently to the data path of the main IP 100 being duplicated and then all inputs being tied, in response to the data path of the main IP 100 being duplicated and then all inputs being tied, etc.). Accordingly, a system designer may not need to perform a separate design of the checker IP 200 in addition to a design of the main IP 100. In addition, a size of the data path of the checker IP 200 may be smaller than a size of the data path of the main IP 100. Accordingly, a size of the checker IP 200 may be smaller than a size of the main IP 100. For example, when the electronic system 10 is implemented as the system-on-chip, an area occupied by the checker IP 200 on the chip may be smaller than an area occupied by the main IP 100 on the chip.

The ECC encoder 300 may generate the encoded data DATA_ENC by performing an ECC encoding operation on the data DATA to be processed in the electronic system 10 or an input data DATA. The ECC encoder 300 may provide the encoded data DATA_ENC to the main IP 100. The ECC encoder 300 may perform the ECC encoding operation by using an error correction code (ECC). The error correction code (ECC) may include at least one of parity, cyclic redundancy code (CRC), checksum, and hamming code, or the like, but is not limited thereto. Accordingly, the encoded data DATA_ENC may include data DATA and checker data generated based on the data DATA. That is, in some example embodiments, the number of bits of the encoded data DATA_ENC may be greater than the number of bits of the data DATA. The data DATA and the encoded data DATA_ENC will be described in more detail with reference to FIG. 4.

The error detection circuit 450 may detect an error of data and/or signals to be transferred or processed within the electronic system 10.

The error detection circuit 450 may detect the error of data based on output data DATA_OUT to be output from the main IP 100. The error detection circuit 450 may detect the error of data based on output data DATA_OUT that has been output from the main IP 100 via a particular data path. For example, the error detection circuit 450 may detect the error of data by performing an ECC decoding on the output data DATA_OUT that has been output from the main IP. The error detection circuit 450 may output a result of detecting on the error of data based on the output data DATA_OUT as a data error detection signal DED and may provide the data error detection signal DED to the fault collection circuit 600. For example, when the error of data is detected, the error detection circuit 450 may output the data error detection signal DED with a first logic level (e.g., '1'). Likewise, for example, when the error of data is not detected, the error detection circuit 450 may not output a separate signal or may output the data error detection signal DED with a second logic level (e.g., '0'). To this end, the error detection circuit 450 may include the ECC decoder 400 configured to output the data error detection signal DED by performing the ECC decoding on the output data DATA_OUT. The ECC decoder 400 may perform the ECC decoding by using an ECC such as parity, cyclic redundancy code (CRC), checksum, and hamming code. The ECC decoder 400 may detect the error of data by using checker data included in the output data DATA_OUT. In some example embodiments, the ECC decoder 400 may perform an operation of correcting the output data DATA_OUT when there is a correctable error in the output data DATA_OUT.

As described herein, a data or signal that is described as "to be" input or output with regard to one or more portions of said electronic systems 10, bus systems 1000, driving assistance systems 2000, or the like may be interchangeably described as being a data or signal "that is" or that has been" input or output with regard to said one or more portions of said electronic systems 10, bus systems 1000, driving assistance systems 2000. For example, the error detection circuit 450, which may detect the error of data based on output data DATA_OUT to be output from the main IP 100, may be interchangeably described as detecting the error of data based on output data DATA_OUT that has been output from the main IP 100 (e.g., via a particular data path). It will be further understood that a data or signal that is "output" from one or more portions of said electronic systems 10, bus systems 1000, driving assistance systems 2000, or the like may be interchangeably referred to herein as being "generated at" or "transmitted from" the one or more portions of said electronic systems 10, bus systems 1000, driving assistance systems 2000, or the like.

Figure 2:
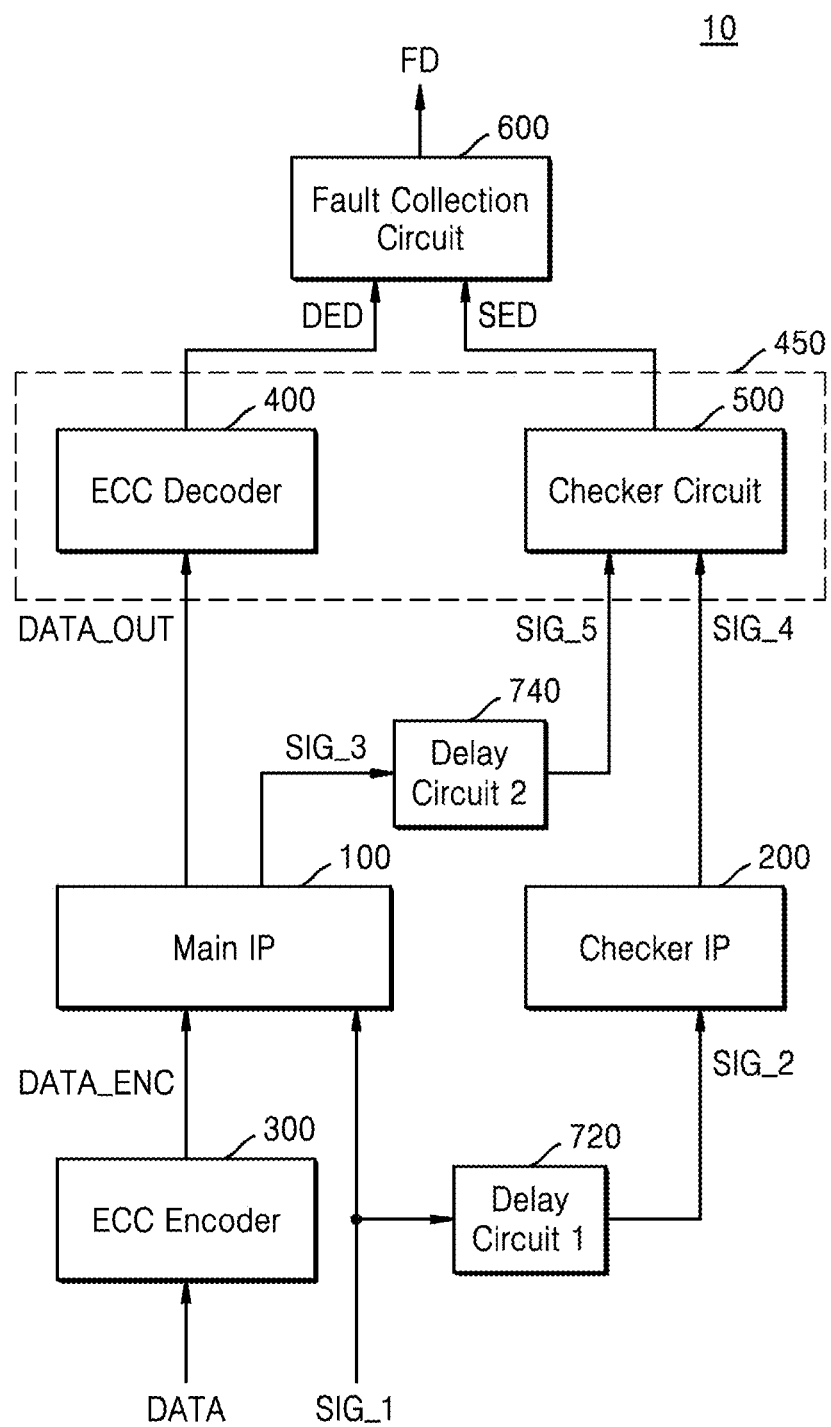
FIG. 2 illustrates an electronic system according to some example embodiments of the inventive concepts.

The error detection circuit 450 may detect an error of the control signal based on the third signal SIG_3 to be output from the main IP 100 and the fourth signal SIG_4 to be output from the checker IP 200. In some example embodiments, as shown in FIG. 2, the error detection circuit 450 may detect the error of the control signal based on a fifth signal SIG_5 in FIG. 2 and the fourth signal SIG_4, in which the fifth signal SIG_5 is a delayed signal of the third signal SIG_3. The error detection circuit 450 may output the result of detecting on the error of data based on the third signal SIG_3 and the fourth signal SIG_4 as a control signal error detection signal SED and may provide the control signal error detection signal SED to the fault collection circuit 600. For example, when the error of data is detected, the error detection circuit 450 may output the control signal error detection signal SED with the first logic level (e.g., '1'). Likewise, for example, when the error of data is not detected, the error detection circuit 450 may not output a separate signal or may output the control signal error detection signal SED with the second logic level (e.g., '0'). To this end, the error detection circuit 450 may include the checker circuit 500 configured to output the control signal error detection signal SED based on the third signal SIG_3 and the fourth signal SIG_4. In some example embodiments, the checker circuit 500 may detect the error of the control signal based on the third signal SIG_3 and the fourth signal SIG_4 by using a cyclic check method. In other words, in some example embodiments, the checker circuit 500 may include a cyclic check unit (CCU).

The fault collection circuit 600 may collect information on a fault occurring in the electronic system 10 based on the data error detection signal DED and the control signal error detection signal SED to be received from the error detection circuit 450. The fault collection circuit 600 may selectively output a fault detection signal FD with respect to the electronic system 10 based on the data error detection signal DED and the control signal error detection signal SED, and thereby may reduce or prevent the occurrence of control errors associated with operation of the electronic system 10 and/or any system or device that uses and/or includes the electronic system 10. For example, when there is the error in the data and/or control signals, the fault collection circuit 600 may output the fault detection signal FD with the first logic level (e.g., '1'). Likewise, for example, when there is no the error in the data and/or control signals, the fault collection circuit 600 may output the fault detection signal FD with the second logic level (e.g., '0'). However, the inventive concepts are not limited thereto, and according to the number of detected errors, the fault collection circuit 600 may output the fault detection signal FD with one level of three or more levels.

According to the electronic system 10 according to some example embodiments of the inventive concepts, the electronic system 10 may effectively detect the error in data and/or control signals, through operations of the main IP 100, the checker IP 200 designed based on the duplication of the main IP 100, and the error detection circuit 450. For example, the electronic system 10 may detect the error of data by using the output data DATA_OUT to be output through the data path of the main IP 100, and may detect the error of control signal with high reliability based on the third signal SIG_3 to be output through the control signal path of the main IP 100 and the fourth signal SIG_4 to be output through the control signal path of the checker IP 200. In addition, while maintaining the high reliability of error detection as described above, the designer may also ensure the ease of design because additional circuit design for the checker IP 200 is not required separately from the circuit design for the main IP 100. In addition, since the checker IP 200 is smaller in size than the main IP 100, the area and/or cost for the system implementation may be reduced, compared to a comparative example in which the checker IP 200 is larger in the size than the main IP 100.

FIG. 2 illustrates an electronic system 10 according to some example embodiments of the inventive concepts. The electronic system 10 may include the main IP 100, the checker IP 200, the ECC encoder 300, the ECC decoder 400, the checker circuit 500, the fault collection circuit 600, a first delay circuit 720, and a second delay circuit 740. Regarding FIG. 2, a description overlapping the electronic system 10 of FIG. 1 will be omitted, and a description will be given focusing on differences from FIG. 1.

The first signal SIG_1 may be input to the main IP 100, and the second signal SIG_2 may be input to the checker IP 200.

The first delay circuit 720 may generate the second signal SIG_2 based on the first signal SIG_1. For example, the first delay circuit 720 may generate the second signal SIG_2 by delaying the first signal SIG_1 by a particular (or, alternatively, predetermined) clock cycle. As a non-limiting example, the first delay circuit 720 may generate the second signal SIG_2 by delaying the first signal SIG_1 by two clock cycles. Accordingly, it will be understood that the second signal SIG_2 may be delayed by a particular clock cycle relative to the first signal SIG_1, for example such that the second signal SIG_2 is delayed in being input to the checker IP 200 by the particular clock cycle in relation to the time at which the first signal SIG_1 is input to the main IP 100.

The main IP 100 may transfer the first signal SIG_1 as the third signal SIG_3, or may output the third signal SIG_3 by processing the first signal SIG_1. For example, the main IP 100 may output the third signal SIG_3 through the control signal path of the main IP 100 based on the first signal SIG_1.

The checker IP 200 may transfer the second signal SIG_2 as the fourth signal SIG_4, or may output the fourth signal SIG_4 by processing the second signal SIG_2. For example, the checker IP 200 may output the fourth signal SIG_4 through the control signal path of the checker IP 200 based on the second signal SIG_2.

The second delay circuit 740 may generate a fifth signal SIG_5 based on the third signal SIG_3. For example, the second delay circuit 740 may generate the fifth signal SIG_5 by delaying the third signal SIG_3 by the particular (or, alternatively, predetermined) clock cycle. Accordingly, it will be understood that the fifth signal SIG_5 may be delayed by a particular clock cycle relative to the fourth signal SIG_4, for example such that the fifth signal SIG_5 is delayed in being input to the error detection circuit 450 by the particular clock cycle. The number (e.g., quantity) of clock cycles to be delayed by the second delay circuit 740 may be equal to the number of clock cycles to be delayed by the first delay circuit 720, such that the second signal SIG_2 and the fifth signal SIG_5 are both delayed in relation to the first signal SIG_1 and the fourth signal SIG_4, respectively, by the same particular clock cycle. As a non-limiting example, the second delay circuit 740 may generate the fifth signal SIG_5 by delaying the third signal SIG_3 by two clock cycles.

The checker circuit 500 may detect the error of the control signal by using the fourth signal SIG_4 and the fifth signal SIG_5. For example, the checker circuit 500 may detect the error of the control signal according to the cyclic check manner by using the fourth signal SIG_4 and the fifth signal SIG_5. For example, the checker circuit 500 may detect the error of the control signal according to the cyclic check manner based on comparing the fourth signal SIG_4 to the fifth signal SIG_5 and may selectively output the control signal error signal SED in response to the detection.

Figure 3:
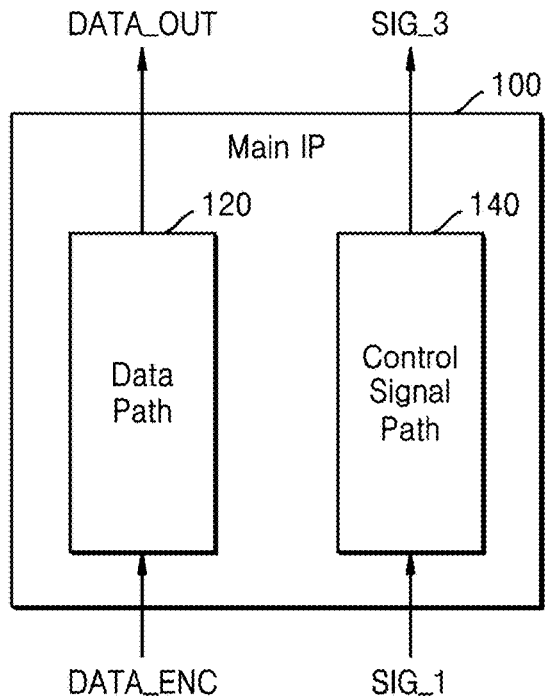
FIG. 3 illustrates a main IP according to some example embodiments of the inventive concepts.

FIG. 3 illustrates the main IP 100 according to some example embodiments of the inventive concepts. The description overlapping FIG. 1 regarding the main IP 100 will be omitted. FIG. 3 is described with reference to FIG. 1 together.

The main IP 100 may include (e.g., may implement) a first data path 120, also referred to herein as a first data path, and a first control signal path 140. FIG. 3 illustrates that the main IP 100 includes one first data path 120, but is not limited thereto, and the main IP 100 may include a plurality of data paths. Likewise, FIG. 3 illustrates that the main IP 100 includes one first control signal path 140, but is not limited thereto, and the main IP 100 may include a plurality of control signal paths.

The main IP 100 may output the output data DATA_OUT by transferring the encoded data DATA_ENC or by processing the encoded data DATA_ENC. In some example embodiments, the first data path 120 may include all circuit elements, through which the encoded data DATA_ENC pass from being input to the main IP 100 to outputting the output data DATA_OUT.

Likewise, the main IP 100 may transfer the first signal SIG_1, or may output the third signal SIG_3 by processing the first signal SIG_1. Accordingly, it will be understood that the first control signal path 140 may be configured to output the third signal SIG_3 based on the first signal SIG_1 being input to the main IP 100 (e.g., being input into the first control signal path 140), for example based on processing the first signal SIG_1. In some example embodiments, the first control signal path 140 may include all circuit elements, through which the first signal SIG_1 pass from being input to the main IP 100 to outputting the third signal SIG_3. Accordingly, it will be understood that the main IP 100 may be configured to receive the encoded data DATA_ENC and the first signal SIG_1 as a first control signal and to output (e.g., generate, transmit, etc.) output data DATA_OUT through first data path 120 based on the encoded data DATA_ENC and to output the third signal SIG_3 as a second control signal through a first control signal path 140 based on the first signal SIG_1 as a first control signal. It will also be understood that the first data path 120 may be configured to output the output data DATA_OUT based on the encoded data DATA_ENC, and the first control signal path 140 may be configured to output the third signal SIG_3 as a control signal based on the first signal SIG_1 as another control signal.

Accordingly, in some example embodiments, the first data path 120 may be a circuit independent to the first control signal path 140. However, the inventive concepts are not limited thereto, and in some cases, the first data path 120 and the first control signal path 140 may share some circuit elements.

When the electronic system 10 detects a fault, the electronic system 10 may detect the error by using the ECC decoding on the data that passed through the first data path 120 of the main IP 100 and may detect the error by using the control signal that passed through the control signal path of the checker IP 200 on the control signal that passed through the first control signal path 140 of the main IP 100.

Accordingly, the electronic system 10 including the main IP 100 according to some example embodiments of the inventive concepts may detect the error occurring in data and/or signals with high reliability, thereby improving performance of the electronic system 10.

Figure 4:
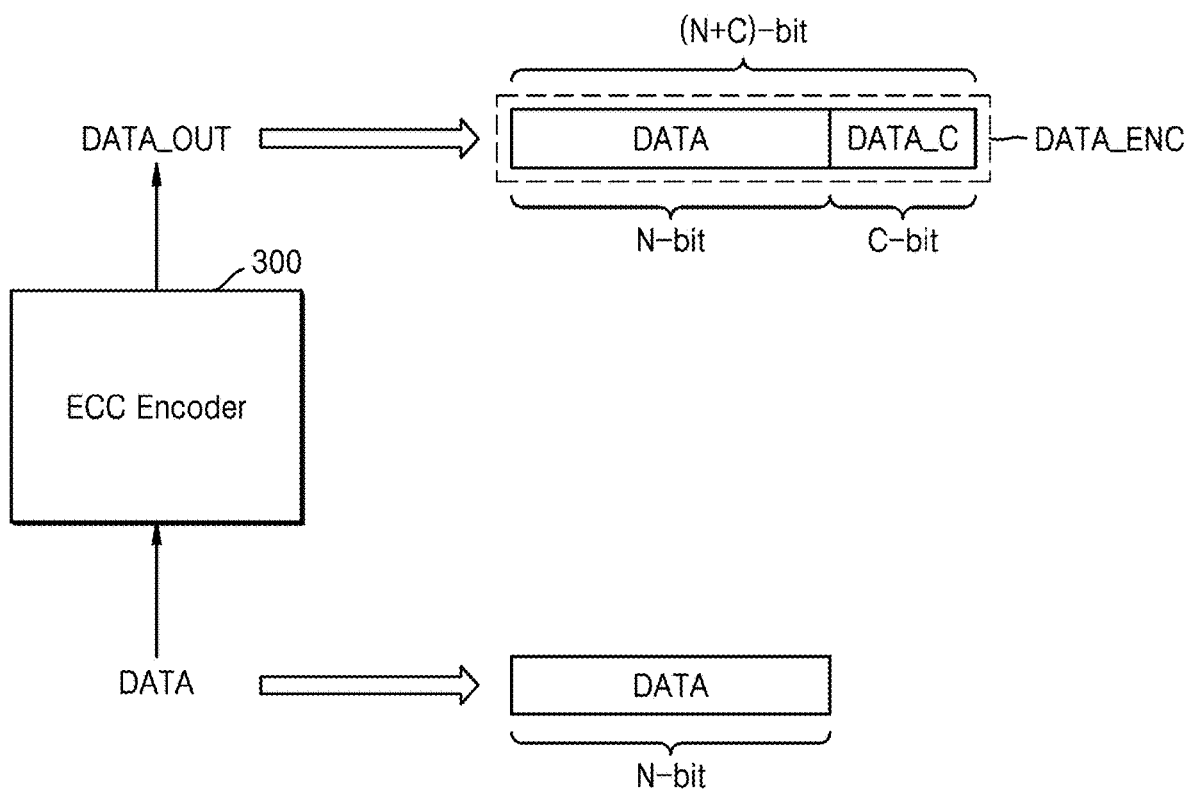
FIG. 4 illustrates an ECC encoder, data, and encoded data, according to some example embodiments of the inventive concepts.

FIG. 4 illustrates the ECC encoder 300, data DATA (also referred to herein as input data), and the encoded data DATA_ENC according to some example embodiments of the inventive concepts. The description overlapping FIG. 1 regarding the ECC encoder 300 will be omitted. FIG. 4 is described with reference to FIG. 1 together.

The ECC encoder 300 may generate the encoded data DATA_ENC by performing the ECC encoding on the data DATA. The number of bits of data DATA may be described as being N-bit, wherein N is a natural number.

In some example embodiments, the ECC encoder 300 may generate the encoded data DATA_ENC by adding a checker data DATA_C to be generated based on the data DATA to the data DATA. That is, the encoded data DATA_ENC may include the data DATA and the checker data DATA_C to be generated based on the data DATA. FIG. 4 illustrates that the checker data DATA_C is added after the data DATA, but is not limited thereto. For example, the checker data DATA_C may be added before the data DATA, and in some cases, the checker data DATA_C may be added in the middle of the data DATA. The number of bits of the checker data DATA_C may be C-bit, wherein C is a natural number. In some example embodiments, C may have a value less than N. In some example embodiments, the ratio of N:C may be 8:1, but is not limited thereto. That is, the number of bits of the encoded data DATA_ENC may be (N+C)-bit and may be greater than the number of bits of the data DATA.

The encoded data DATA_ENC may be input to the main IP 100. The main IP 100 may output the output data DATA_OUT by transferring or processing the encoded data DATA_ENC. For the explanation of some example embodiments, it may be assumed that the main IP 100 transfers the encoded data DATA_ENC as the output data DATA_OUT.

In some example embodiments, the ECC decoder 400 may detect the error of data, and thus responsively output the data error detection signal DED, by performing the ECC decoding on the output data DATA_OUT. For example, the ECC decoder 400 may detect the error of data by generating comparison checker data by using the data included in the output data DATA_OUT and then comparing the generated comparison checker data to the checker data included in the output data DATA_OUT. For example, when the generated comparison checker data and the checker data included in the output data DATA_OUT do not match, the ECC decoder 400 may determine that the error has occurred in the data and may output the error detection signal DED indicating detection of the error. It will be understood that performing encoding or decoding "of" data may be referred to interchangeably herein with performing the encoding or decoding "on" the data.

Figure 5:
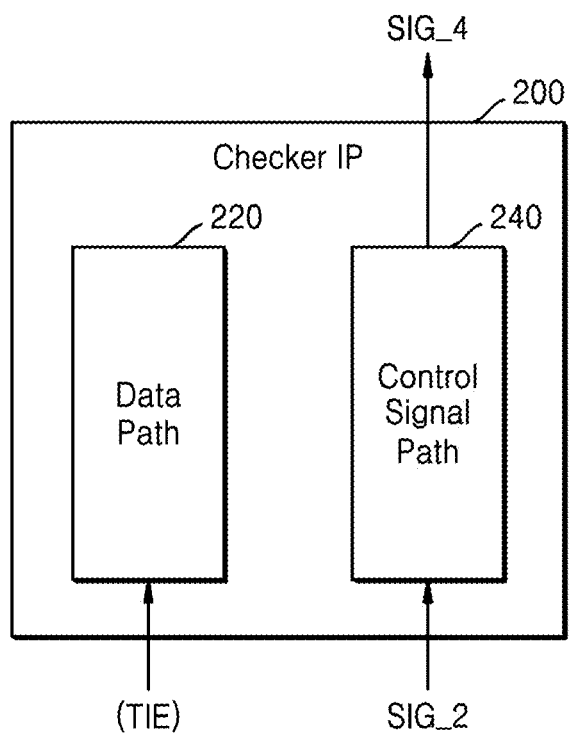
FIG. 5 illustrates a checker IP according to some example embodiments of the inventive concepts.

FIG. 5 illustrates the checker IP 200 according to some example embodiments of the inventive concepts. The description overlapping FIG. 1 regarding the checker IP 200 will be omitted. FIG. 5 is described with reference to FIGS. 1 and 3 together.

The checker IP 200 may include (e.g., may implement) a second data path 220, and a second control signal path 240. In some example embodiments, the checker IP 200 may omit the second data path 220. FIG. 5 illustrates that the checker IP 200 includes one second data path 220, but is not limited thereto, and the checker IP 200 may include a plurality of data paths. Likewise, FIG. 5 illustrates that the checker IP 200 includes one second control signal path 240, but is not limited thereto, and the checker IP 200 may include a plurality of control signal paths.

The checker IP 200 may output the fourth signal SIG_4 by transferring the second signal SIG_2 or by processing the second signal SIG_2. Accordingly, it will be understood that the second control signal path 240 may be configured to output the fourth signal SIG_4 based on the second signal SIG_2 being input to the checker IP 200 (e.g., being input into the second control signal path 240), for example based on processing the second signal SIG_2. Accordingly, it will be understood that the checker IP 200 may be configured to output the fourth signal SIG_4 as a fourth control signal through the second control signal path 240 based on the second signal SIG_2 as a third control signal. It will be understood that the second control signal path 240 may be configured to output the fourth signal SIG_4 as a control signal based on the second signal SIG_2 that is delayed by the particular clock cycle relative to the first signal SIG_1. In some example embodiments, the second control signal path 240 may include all circuit elements, through which the second signal SIG_2 pass from being input to the checker IP 200 to outputting the fourth signal SIG_4.

In some example embodiments, the checker IP 200 may be designed based on the duplication of main IP 100. Accordingly, the second control signal path 240 of the checker IP 200 may include circuit components that are the same or substantially the same (e.g., the same within manufacturing tolerances and/or material tolerances) as those circuit components of the first control signal path 140 of the main IP 100. It will be understood that "circuit component" and "circuit element" may be used interchangeably herein. The second data path 220 of the checker IP 200 may be designed through boundary optimization after (e.g., subsequently to, in response to, etc.) duplicating the first data path 120 of the main IP 100 and tying all inputs. Accordingly, no signal may be input to the second data path 220 of the checker IP 200, and the second data path 220 of the checker IP 200 may not output any output signal. In other words, the input of the second data path 220 of the checker IP 200 and the output of the second data path 220 of the checker IP 200 that is dependent to the input may be omitted in the second data path 220.

The second data path 220 of the checker IP 200 may be smaller in size than the first data path 120 of the main IP 100. Accordingly, the size of the checker IP 200 may be smaller than the size of the main IP 100. In other words, when the electronic system 10 is implemented as the system-on-chip, the area (e.g., circuit area) occupied by the checker IP 200 on the chip of the system-on-chip may be smaller than the area (e.g., circuit area) occupied by the main IP 100 on the chip of the system-on-chip. For example, when the electronic system 10 is implemented as the system-on-chip, the area (e.g., circuit area) occupied by the second data path 220 on the chip of the system-on-chip may be smaller than the area (e.g., circuit area) occupied by the first data path 120 on the chip of the system-on-chip.

Figure 6:
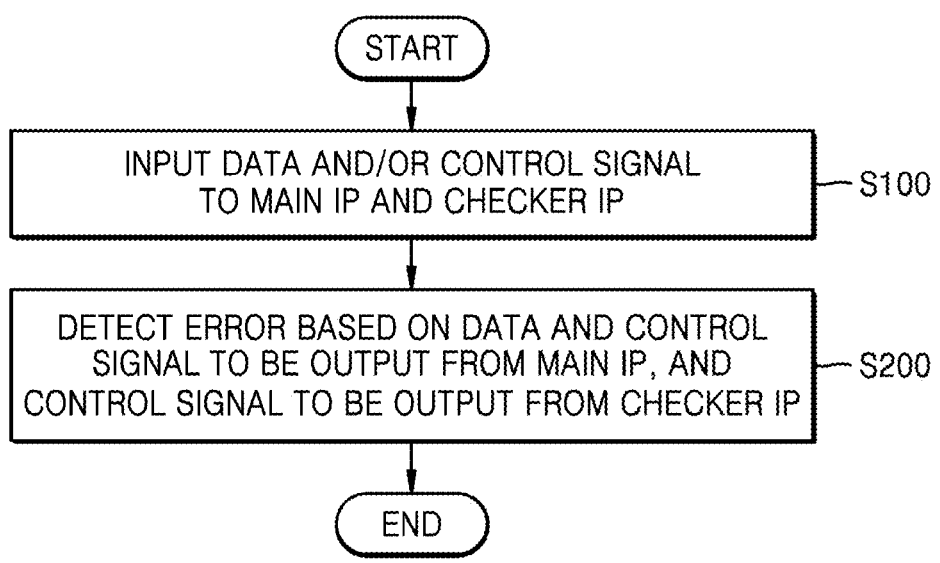
FIG. 6 illustrates a flowchart of a method of operating an electronic system according to some example embodiments of the inventive concepts.

FIG. 6 illustrates a flowchart of a method of operating an electronic system according to some example embodiments of the inventive concepts. FIG. 6 will be described with reference to FIGS. 1, 3, and 5 together.

Data and/or control signals may be input to the main IP 100 and the checker IP 200 (S100). Operation S100 will be described in more detail with reference to FIG. 7.

The electronic system 10 may detect the error based on the data and the control signal to be output from the main IP 100, and the control signal to be output from the checker IP 200 (S200). For example, the electronic system 10 may detect the error of data based on the output data to be output from the main IP 100, and may detect the error of control signal based the third signal SIG_3 to be output from the main IP 100 and the fourth signal SIG_4 to be output from the checker IP 200. Operation S200 will be described in more detail with reference to FIG. 8.

Figure 7:
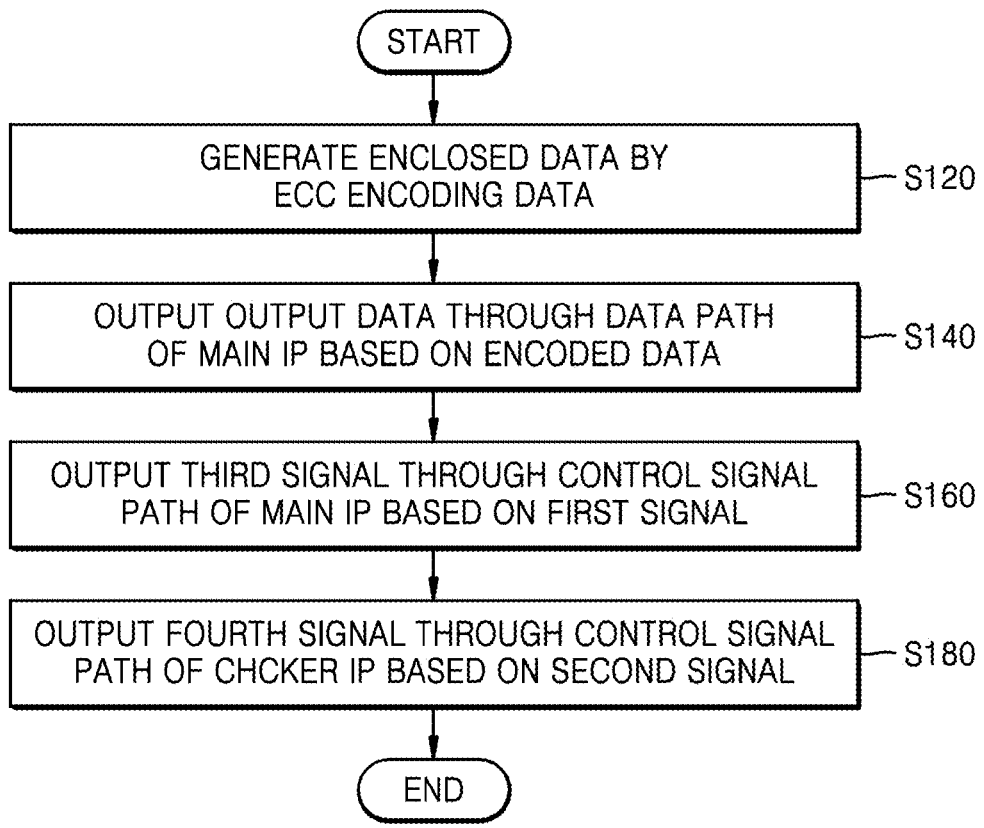
FIG. 7 illustrates a flowchart of a method of transmitting data and signals of an electronic system according to some example embodiments of the inventive concepts.

FIG. 7 illustrates a flowchart of a method of transferring data and signal of an electronic system according to some example embodiments of the inventive concepts. In particular, FIG. 7 may show a detailed flowchart corresponding to operation S100 of FIG. 6. FIG. 7 will be described with reference to FIGS. 1, 3, and 5 together.

The electronic system 10 may generate the encoded data DATA_ENC by ECC encoding (e.g., by performing ECC encoding of) the data DATA (S120). For example, the ECC encoder 300 may generate the encoded data DATA_ENC by ECC encoding the data DATA. The encoded data DATA_ENC may include the data DATA and a checker data to be generated based on the data DATA. Accordingly, the number of bits of the encoded data DATA_ENC may be greater than the number of bits of the data DATA.

The main IP 100 included in the electronic system 10 may output the output data DATA_OUT through the first data path 120 of the main IP 100 based on the encoded data DATA_ENC (S140). The main IP 100 may transfer the encoded data DATA_ENC as the output data DATA_OUT, or may output the output data DATA_OUT by processing the encoded data DATA_ENC.

The main IP 100 included in the electronic system 10 may output the third signal SIG_3 through the first control signal path 140 of the main IP 100 based on the first signal SIG_1 (S160). The main IP 100 may transfer the first signal SIG_1 as the third signal SIG_3, or may output the third signal SIG_3 by processing the first signal SIG_1.

The checker IP 200 included in the electronic system 10 may output the fourth signal SIG_4 through the second control signal path 240 of the checker IP 200 based on the second signal SIG_2 (S180). The checker IP 200 may transfer the second signal SIG_2 as the fourth signal SIG_4, or may output the fourth signal SIG_4 by processing the second signal SIG_2. In some example embodiments, the second signal SIG_2 may represent a signal in which the first signal SIG_1 is delayed by the particular (or, alternatively, predetermined) clock cycle.

Figure 8:
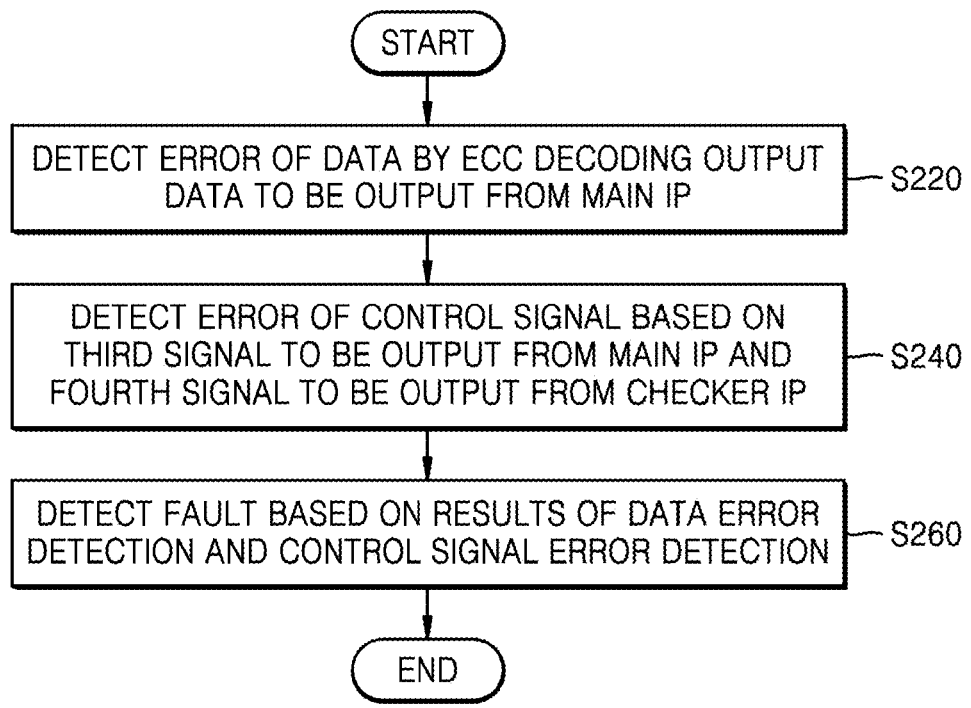
FIG. 8 illustrates a flowchart of a method of detecting faults of an electronic system according to some example embodiments of the inventive concepts.

FIG. 8 illustrates a flowchart of a method of detecting fault of an electronic system according to some example embodiments of the inventive concepts. In particular, FIG. 8 may show a detailed flowchart corresponding to operation S200 of FIG. 6. FIG. 8 will be described with reference to FIGS. 1, 3, and 5 together.

The electronic system 10 may detect the error of data by ECC decoding the output data DATA_OUT to be output from the main IP 100 (S220). For example, the error detection circuit 450 may detect the error of data by performing ECC decoding of the output data DATA_OUT to be output through the first data path 120 of the main IP 100. As described herein, signals that are described as "to be output" by one or more elements of the electronic system 10 may be understood to include signals that are actually output by the one or more elements of the electronic system 10 to one or more other elements of the electronic system 10, for example via one or more signal paths of the electronic system 10. For example, at S220, the error detection circuit 450 may detect the error of data by performing ECC decoding of the output data DATA_OUT that is output from the main IP 100 to the error detection circuit 450 through the first data path 120 of the main IP 100. To this end, the error detection circuit 450 may include the ECC decoder 400, which may be configured to perform such ECC decoding. In other words, the ECC decoder 400 may detect the error of data by ECC decoding the output data DATA_OUT to be output through the first data path 120 of the main IP 100. The ECC decoder 400 may output the result of data error detection as the data error detection signal DED and may provide the data error detection signal DED to the fault collection circuit 600. Restated, the ECC decoder 400 may be configured to perform the ECC decoding of the output data to detect the error of data (S220) and output a data error detection signal DED in response to the detection of the error of data. Accordingly, it will be understood that operation S220 may include detecting an error of input data (e.g., data input to the electronic system 10) by performing ECC decoding of output data that is output from the first data path 120 of the main IP 100 (e.g., where the output data is output from the first data path 120 based on processing of the input data). It will be understood that outputting a signal (e.g., ECC decoder 400 outputting the data error detection signal DED) may include generating the signal (e.g., ECC decoder 400 generating the data error detection signal DED) and/or transmitting the signal to an external element (e.g., ECC decoder 400 transmitting the data error detection signal DED to the fault collection circuit 600).

The electronic system 10 may detect the error of the control signal based on the third signal SIG_3 to be output from the main IP 100 and the fourth signal SIG_4 to be output from the checker IP 200 (S240). For example, the error detection circuit 450 may detect the error of the control signal based on the third signal SIG_3 to be output through the first control signal path 140 of the main IP 100 and the fourth signal SIG_4 to be output through the second control signal path 240 of the checker IP 200. For example, the error detection circuit 450 may detect the error of the control signal based on a signal (e.g., the third signal SIG_3, which may be referred to as a first signal) that is output by the main IP 100 to the error detection circuit 450 (e.g., to checker circuit 500) through the first control signal path 140 of the main IP 100 and another signal (e.g., the fourth signal SIG_4 which may be referred to as a second signal) that is output by the checker IP 200 to the error detection circuit (e.g., checker circuit 500 through the second control signal path 240 (e.g., second control signal path) of the checker IP 200. In some example embodiments, for example, the error detection circuit 450 may detect the error of the control signal based on a fifth signal and the fourth signal SIG_4 to be output through the second control signal path 240 of the checker IP 200, in which the fifth signal is a signal in which the third signal SIG_3 to be output through the first control signal path 140 of the main IP 100 is delayed by the particular (or, alternatively, predetermined) clock cycle. To this end, the error detection circuit 450 may include the checker circuit 500. In other words, the checker circuit 500 may detect the error of the control signal based on the third signal SIG_3 to be output through the first control signal path 140 of the main IP 100 and the fourth signal SIG_4 to be output through the second control signal path 240 of the checker IP 200. The checker circuit 500 may output the result of the error detection of the control signal as the control signal error detection signal SED and may provide the control signal error detection signal SED to the fault collection circuit 600. Restated, the checker circuit 500 may be configured to detect the error of the control signal based on the third signal SIG_3 and the fourth signal SIG_4 (S240) and output a control signal error detection signal SED in response to the detection of the error of the control signal. Accordingly, it will be understood that operation S240 may include detecting an error of a control signal based on the third signal SIG_3 that is output from the first control signal path 140 of the main IP 100 and the fourth signal SIG_4 that is output from the second control signal path 240 of the checker IP 200. Referring to at least FIG. 2, detecting the error of the control signal at S240 may include generating a fifth signal SIG_5 by delaying the third signal SIG_3 by a particular clock cycle (e.g., at the second delay circuit 740) and outputting a control signal error detection signal SED based on comparing the fifth signal SIG_5 to the fourth signal SIG_4 (e.g., at the checker circuit 500, outputting the control signal error detection signal SED selectively in response to a result of the comparison of the fourth and fifth signals SIG_4 and SIG_5).

The electronic system 10 may detect the fault of the electronic system 10 based on the results of the data error detection and the control signal error detection (S260). For example, the fault collection circuit 600 may detect the faults of the data and/or signals to be processed in the electronic system 10 based on the data error detection signal DED to be received from the ECC decoder 400 and the control signal error detection signal SED to be received from the checker circuit 500. The fault collection circuit 600 may selectively output the fault detection signal FD based on (e.g., in response to) the data error detection signal DED and the control signal error detection signal SED. Accordingly, it will be understood that the fault collection circuit 600 may receive the data error detection signal DED from the error detection circuit 450 (e.g., the ECC decoder 400), receive the control signal error detection signal SED from the error detection circuit 450 (e.g., the checker circuit 500), and selectively output a fault detection signal with respect to the electronic system 10 in response to the data error detection signal DED and the control signal error detection signal SED.

Figure 9:
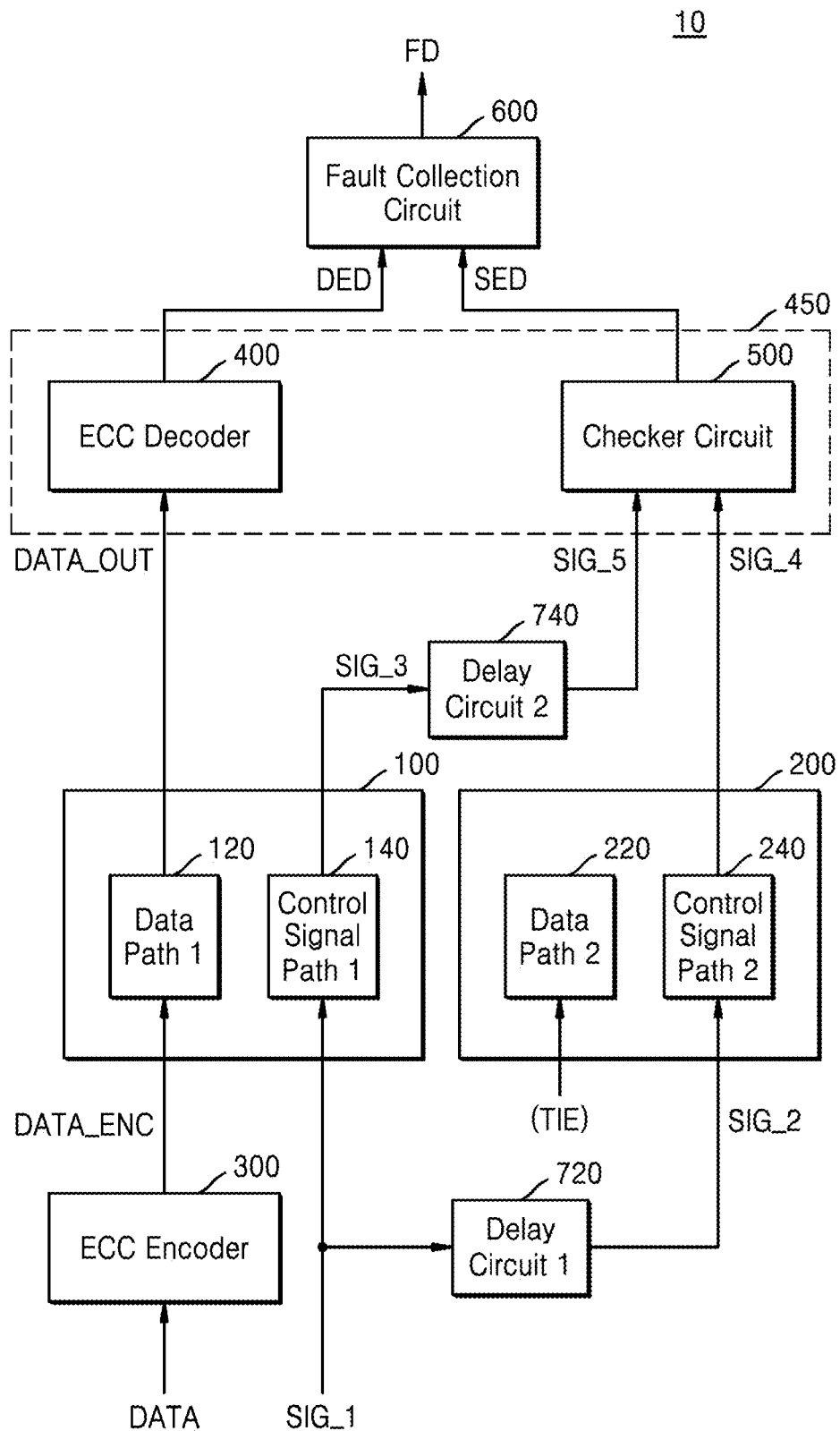
FIG. 9 illustrates an electronic system according to some example embodiments of the inventive concepts.

FIG. 9 illustrates an electronic system 10 according to some example embodiments of the inventive concepts. The electronic system 10 of FIG. 9 illustrates some example embodiments in which the main IP 100 of FIG. 3 and the checker IP 200 of FIG. 5 are applied to the electronic system 10 of FIG. 2. That is, the description of the electronic system 10 of FIG. 9 overlapping FIGS. 1 to 8 will be omitted.

The electronic system 10 may include the main IP 100, the checker IP 200, the ECC encoder 300, the ECC decoder 400, the checker circuit 500, the fault collection circuit 600, the first delay circuit 720, and the second delay circuit 740.

The main IP 100 may include (e.g., may implement) the first data path 120 and the first control signal path 140. The main IP 100 may output the output data DATA_OUT through the first data path 120 based on the encoded data DATA_ENC. The main IP 100 may output the third signal SIG_3 through the first control signal path 140 based on the first signal SIG_1.

The first delay circuit 720 may generate the second signal SIG_2 by delaying the first signal SIG_1 by the particular (or, alternatively, predetermined) clock cycle and may provide the generated second signal SIG_2 to the checker IP 200.

The checker IP 200 may include (e.g., may implement) a second data path 220 and a second control signal path 240. The checker IP 200 may output the fourth signal SIG_4 through the second control signal path 240 based on the second signal SIG_2. No data may be input to the second data path 220, and the second data path 220 may not output any data.

The ECC decoder 400 may detect the error of data by using the output data DATA_OUT to be output through the first data path 120.

The second delay circuit 740 may generate the fifth signal SIG_5 by delaying the third signal SIG_3 to be output through the first control signal path 140 by the particular (or, alternatively, predetermined) clock cycle (which may be the same as the particular clock cycle by which the first delay circuit 720 delays the first signal SIG_1 to generate the second signal SIG_2) and may provide the generated fifth signal SIG_5 to the checker circuit 500.

The checker circuit 500 may detect the error of the control signal based on the fifth signal SIG_5 and the fourth signal SIG_4 to be output through the second control signal path 240.

Figure 10:
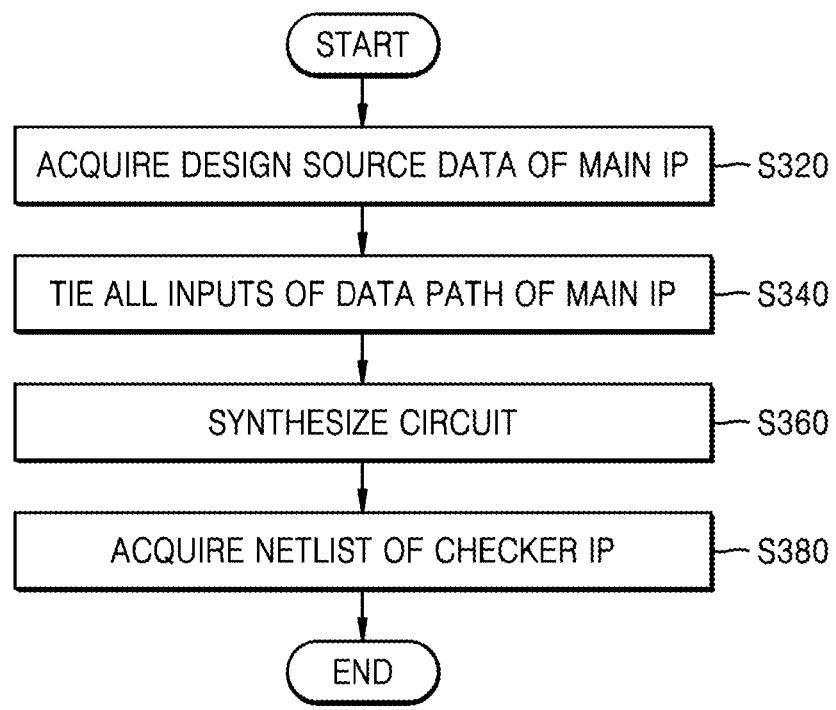
FIG. 10 is a flowchart illustrating designing of a checker IP according to some example embodiments of the inventive concepts.

FIG. 10 illustrates a flowchart of designing a checker IP according to some example embodiments of the inventive concepts. FIG. 10 is described with reference to FIG. 1 together.

The designer of the electronic system 10 may acquire design source data of the main IP 100 (S320). For example, the designer may acquire the design source data of the main IP 100, which is implemented in a hardware description language (HDL), or the like.

The designer may tie all inputs of the data path of the main IP 100 (S340). For example, the designer may set a function such that all inputs of the data path are tied based on the design source data of the main IP 100.

The designer may synthesize a circuit (S360). That is, the circuit may be synthesized based on the design source data to be finally acquired according to operation S340.

The designer may acquire a netlist (NetList) of the checker IP 200 (S380). The netlist may represent data in a form that may be implemented in an actual chip through a layout process.

Figure 11:
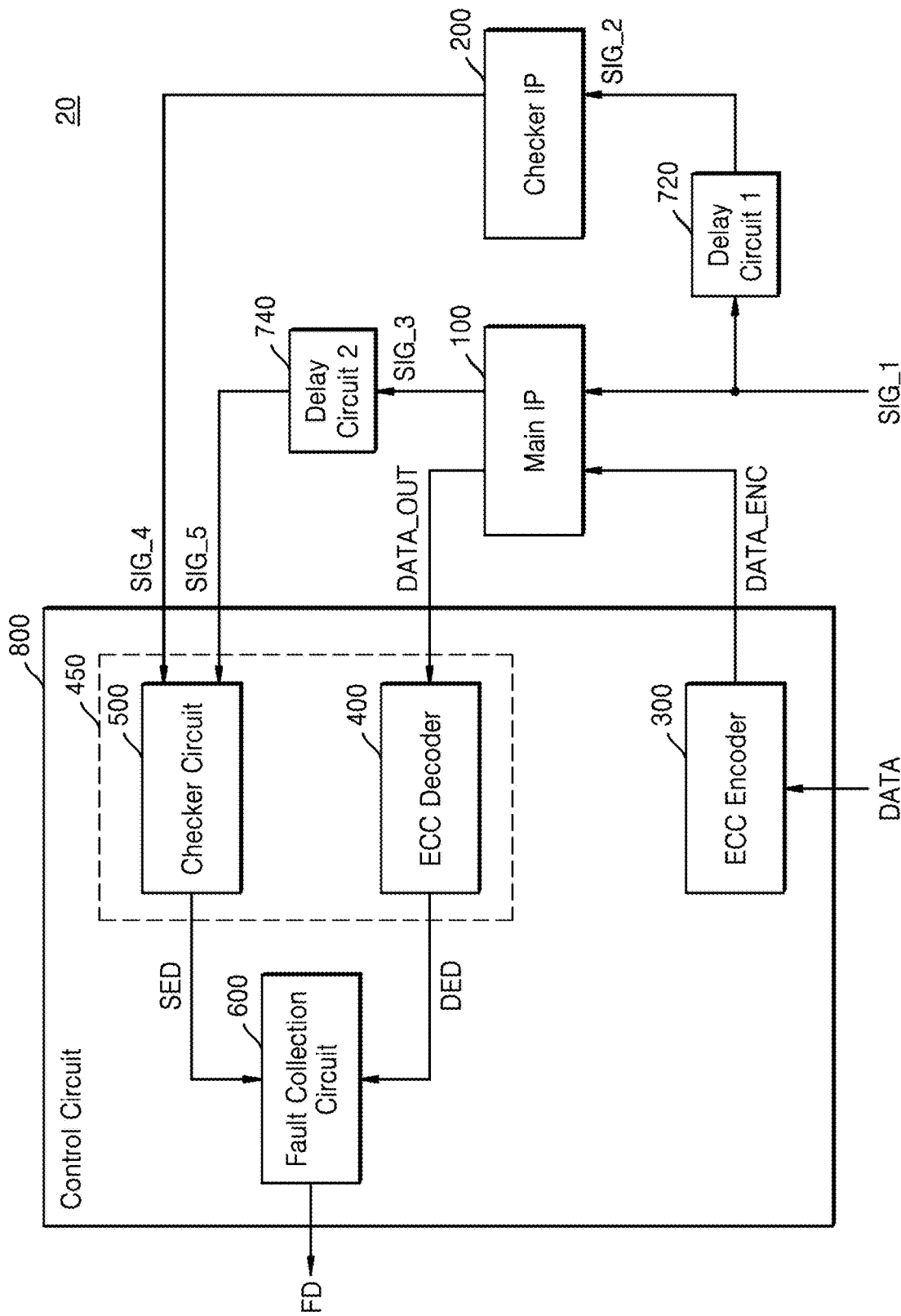
FIG. 11 illustrates an electronic system according to some example embodiments of the inventive concepts.

FIG. 11 illustrates an electronic system 20 according to some example embodiments of the inventive concepts. FIG. 11 illustrates some example embodiments in which the ECC encoder 300, the ECC decoder 400, the checker circuit 500, and the fault collection circuit 600 of the electronic system 10 of FIG. 2 may be implemented as one control circuit 800. Descriptions overlapping FIGS. 1 to 9 will be omitted with respect to FIG. 11.

The electronic system 20 may include the main IP 100, the checker IP 200, the control circuit 800, the first delay circuit 720, and the second delay circuit 740. The control circuit 800 may include an ECC encoder 300, an ECC decoder 400, a checker circuit 500, and the fault collection circuit 600.

In some example embodiments, the control circuit 800 may be implemented as a digital circuit (e.g., one or more instances of processing circuitry) to perform all the functions of the ECC encoder 300, the ECC decoder 400, the checker circuit 500, and the fault collection circuit 600. For example, the control circuit 800 may provide the encoded data DATA_ENC to the main IP 100 by performing ECC encoding on the data DATA. For example, the control circuit 800 may detect the error of data by performing ECC decoding on the output data DATA_OUT to be output from the main IP 100. For example, the control circuit 800 may detect the error of the control signal by using the fourth signal SIG_4 and the fifth signal SIG_5. The control circuit 800 may output the fault detection signal FD with respect to the electronic system 20 based on results of the data error detection and the control signal error detection.

Figure 12:
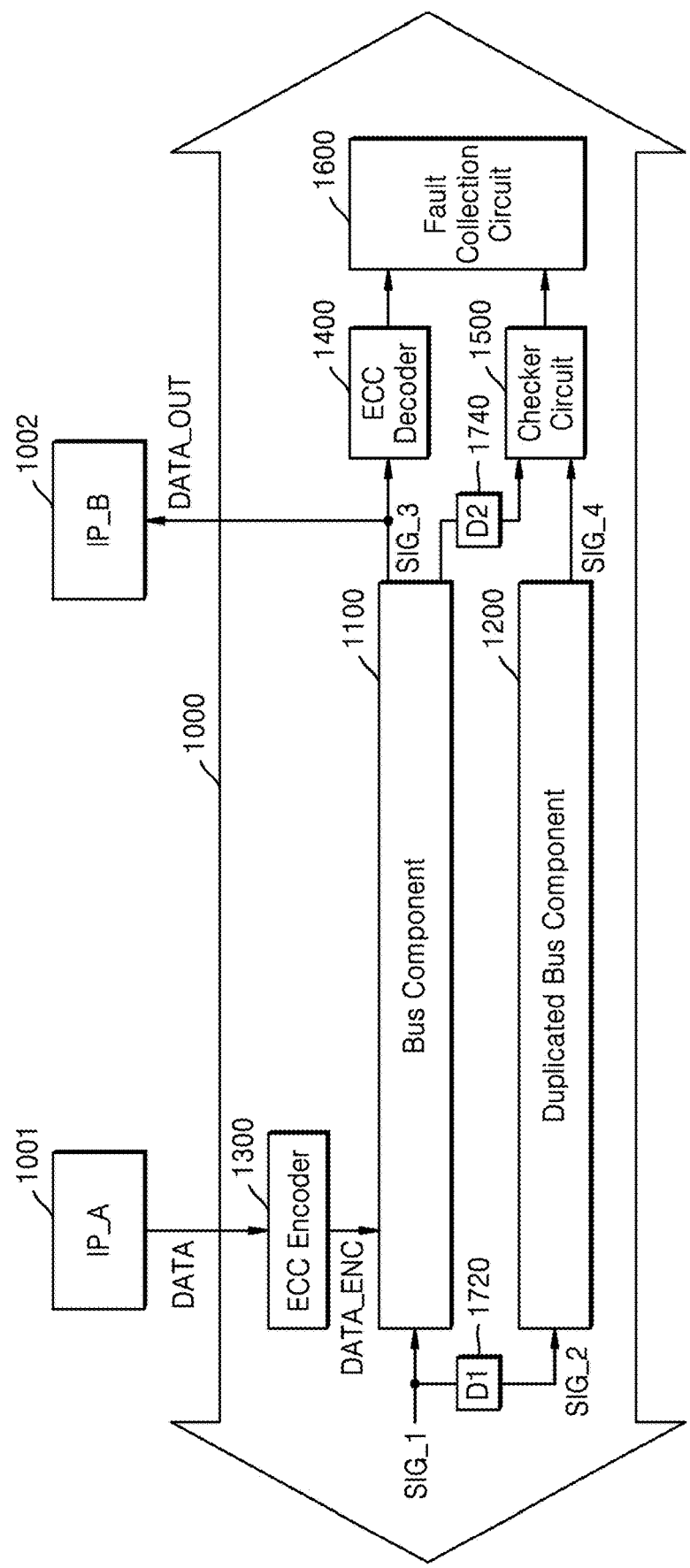
FIG. 12 illustrates a bus system, a first IP, and a second IP, according to some example embodiments of the inventive concepts.

FIG. 12 illustrates a bus system 1000, a first IP 1001, and a second IP 1002 according to some example embodiments of the inventive concepts. The bus system 1000 of FIG. 12 illustrates some example embodiments in which the electronic systems 10 and 20 described with reference to FIGS. 1 to 11 are applied to (e.g., included in) the bus system. In other words, the functions of the components described with reference to FIGS. 1 to 11 may be applied to FIG. 12 as well.

The first IP 1001 and the second IP 1002 may exchange data or various signals with each other through the bus system 1000.

The bus system 1000 may include a bus component 1100, a duplicated bus component 1200, an ECC encoder 1300, an ECC decoder 1400, a checker circuit 1500, a fault collection circuit 1600, and a first delay circuit 1720, and a second delay circuit 1740.

The bus component 1100 may correspond to the main IP 100 described with reference to FIGS. 1 to 11, and therefore in some example embodiments the bus component 110 may be referred to as a first IP or main IP. The bus component 1100 may include a first data path and a first control signal path. The bus component 1100 may output the output data DATA_OUT by transferring the encoded data DATA_ENC through the first data path. The bus component 1100 may output the third signal SIG_3 (e.g., as a first control signal) through the first control signal path based on the first signal SIG_1.

The duplicated bus component 1200 may correspond to the checker IP 200 described with reference to FIGS. 1 to 11, and therefore in some example embodiments the bus component 110 may be referred to as a second IP or checker IP. The duplicated bus component 1200 may include the second data path and the second control signal path. The duplicated bus component 1200 may output the fourth signal SIG_4 (e.g., as a second control signal) through the second control signal path based on the second signal SIG_2. No data may be input to the second data path, and the second data path may not output any data.

Each of the ECC decoder 1400, the checker circuit 1500, the fault collection circuit 1600, the first delay circuit 1720, and the second delay circuit 1740 may respectively correspond to the ECC decoder 400, the checker circuit 500, the fault collection circuit 600, the first delay circuit 720, and the second delay circuit 740, described with reference to FIGS. 1 to 11.

According to the bus system 1000 according to some example embodiments of the inventive concepts, the bus system 1000 may detect the error of data DATA and the error of the control signals to be transmitted and received between a first IP 1001 and a second IP 1002 with high reliability. In addition, since a size of the duplicated bus component 1200 may be designed smaller than a size of the bus component 1100, the area and/or cost on the chip may be reduced in the design.

Figure 13:
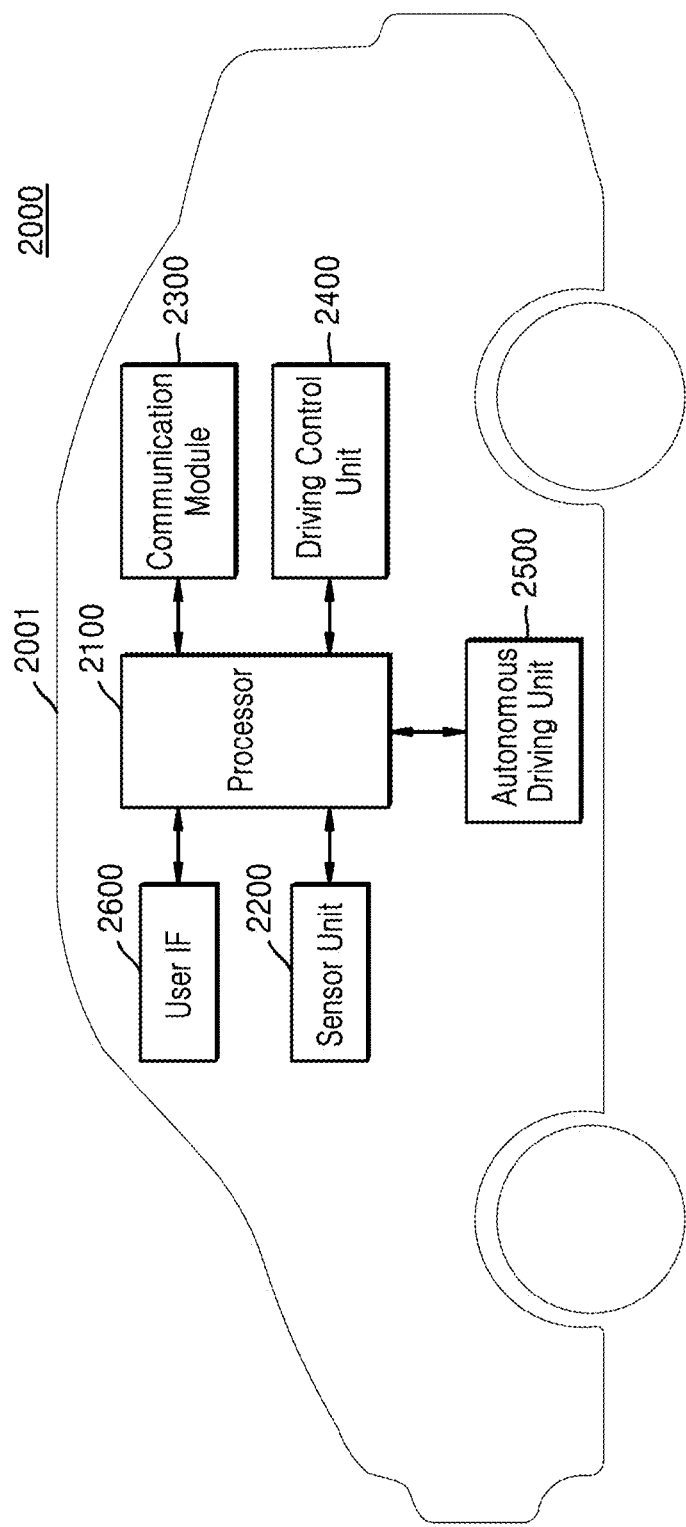
FIG. 13 illustrates a driving assistance system according to some example embodiments of the inventive concepts.

FIG. 13 illustrates a driving assistance system 2000 according to some example embodiments of the inventive concepts. The driving assistance system 2000 may be included within a vehicle 2001, which may be any well-known vehicle, including an automobile, including any vehicle which may be configured to implement at least partially autonomous driving thereof. The driving assistance system 2000 may include a processor 2100, a sensor unit 2200, a communication module 2300, a driving control unit 2400, an autonomous driving unit 2500, and a user interface 2600.

The processor 2100 may control overall operations of an apparatus to which the driving assistance system 2000 is applied. The processor 2100 may include one processor core (Single Core) or a plurality of processor cores (Multi-Core). The processor 2100 may process or execute programs and/or data stored in a memory of the driving assistance system 2000. In some example embodiments, the processor 2100 may include an NPU capable of processing calculations based on various types of networks such as a convolution neural network (CNN), a region with convolution neural network (R-CNN), a region proposal network (RPN), a recurrent neural network (RNN), a fully convolutional network (FCN), and a long short-term memory (LSTM) network, and a classification network.

The sensor unit 2200, also described herein as simply a "sensor," may collect information about an object to be sensed by the apparatus to which the driving assistance system 2000 is applied (e.g., vehicle 2201). In some example embodiments, the sensor unit 2200 may be an image sensor unit. In some example embodiments, the sensor unit 2200 may include at least one image sensor. The sensor unit 2200 may sense or receive an image signal from the outside of the apparatus to which the driving assistance system 2000 is applied, and convert the image signal into image data, that is, an image frame. In some example embodiments, the sensor unit 2200 may be a distance sensor unit, also referred to herein as simply a "distance sensor." In some example embodiments, the sensor unit 2200 may include at least one distance sensor. The distance sensor may include at least one of various types of sensing devices, such as a light detection and ranging (LIDAR) sensor, a radio detection and ranging (RADAR) sensor, a time of flight (ToF) sensor, an ultrasonic sensor, and an infrared sensor. Meanwhile, the LIDAR sensor and the RADAR sensor may be classified according to the effective measurement distance. For example, the LIDAR sensor may be classified into a long LIDAR sensor and a short LIDAR sensor and the RADAR sensor may be classified into a long RADAR sensor and a short RADAR sensor. In addition, the sensor unit 2200 may include at least one of a geomagnetic sensor, a position sensor (e.g., a GPS), an acceleration sensor, an air pressure sensor, a temperature/humidity sensor, a proximity sensor, and a gyroscope sensor, but is not limited thereto. Since functions of the respective sensors may be intuitively deduced by those skilled in the art from names thereof, detailed descriptions thereof will be omitted.

The communication module 2300 may transmit and/or receive data of the apparatus to which the driving assistance system 2000 is applied. For example, the communication module 2300 may communicate with an external object of the apparatus. In some example embodiments, the communication module 2300 may perform communication in a manner of a vehicle to everything (V2X). For example, the communication module 2300 may perform communication in the manner of a vehicle to vehicle (V2V), a vehicle to infra (V2I), a vehicle to pedestrian (V2P), and vehicle to nomadic devices (V2N). However, the inventive concepts are not limited thereto, and the communication module 2300 may transmit and receive data by various known communication manners. For example, the communication module 2300 may perform communication by, for example, 3G, LTE, Wi-Fi, Bluetooth, Bluetooth low energy (BLE), Zigbee, near field communication (NFC), or a communication method through ultrasonic waves, or the like, and may include both short range communication and long range communication.

The driving control unit 2400, also referred to herein as simply a "driving controller," may include any of a vehicle steering device configured to control the direction of a vehicle, a throttle device configured to control acceleration and/or deceleration by controlling a tolerance motor or engine, a brake device configured to control the braking of the vehicle, and an external lighting device, or the like.

The autonomous driving unit 2500, also referred to herein as simply an "autonomous driving controller," may include a computing device configured to implement autonomous control of the driving control unit 2400 (e.g., control the driving control unit 2400 to cause autonomous driving of the vehicle 2001 to be implemented). For example, the autonomous driving unit 2500 may include at least one of components of the apparatus in which the driving assistance system 2000 is implemented. The autonomous driving unit 2500 may include a memory for storing a plurality of program instructions and one or more processors for executing the program instructions. The autonomous driving unit 2500 may be configured to control the driving control unit 2400 based on the sensing signal to be output from the sensor unit 2200.

The user interface 2600 may include various electronic devices and mechanical devices included in a driver's seat or a passenger seat, such as a display indicating an instrument panel of the vehicle.

In the automotive industry, high levels of safety systems may be required, from an airbag arrangement system to an advanced driver assistance systems (ADAS). As a representative example, an electronic device equipped with the high level of safety system may be certified according to the international standard ISO 26262 for motor vehicle functional safety. In particular, in order to be certified for ISO 26262 ASIL-D, the electronic device should satisfy that the single point fault metric (SPFM) is 99% or more. In other words, the electronic device that requires the high level of safety is required to detect 99% or more of single point fault metric.

The electronic systems 10 and 20 described with reference to FIGS. 1 to 12 may be applied at least one of the processor 2100, the sensor unit 2200, the communication module 2300, the driving control unit 2400, the autonomous driving unit 2500 and the user interface 2600 included in the driving assistance system 2000.

In some example embodiments, some or all of any of the systems according to any of the example embodiments, including some or all of electronic system 10, electronic system 20, the bus system 1000, and/or the driving assistance system 2000 according to any of the example embodiments (including some or all of the main IP 100, the checker IP 200, the ECC encoder 300, the fault collection circuit 600, the error detection circuit 450, the first delay circuit 720, the second delay circuit 740, the control circuit 800, the bus component 1100, the duplicated bus component 1200, the ECC encoder 1300, the ECC decoder 1400, the checker circuit 1500, the fault collection circuit 1600, the first delay circuit 1720, the second delay circuit 1740, the processor 2100, the sensor unit 2200, the communication module 2300, the driving control unit 2400, the autonomous driving unit 2500, and/or the user interface 2600), may include, may be included in, and/or may be implemented by one or more instances (e.g., articles, pieces, units, etc.) of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, or memory, for example a solid state drive (SSD), storing a program of instructions, and a processor configured to execute the program of instructions to implement the functionality of some or all of any of the systems according to any of the example embodiments. It will be understood that, as described herein, an element (e.g., processing circuitry, digital circuits, etc.) that is described as "implementing" an element (e.g., main IP 100, checker IP 200, etc.) will be understood to implement the functionality of said implemented element (e.g., the functionality of main IP 100, the functionality of checker IP 200, etc.).

The driving assistance system 2000 to which the electronic systems 10 and 20 according to some example embodiments of the inventive concepts are applied may detect 99% or more of the single point fault, and also may reduce a design area.

While the inventive concepts has been particularly shown and described with reference to example embodiments thereof, it will be understood that various changes in form and details may be made therein without departing from the spirit and scope of the following claims.

What is claimed is:

1. An electronic system comprising:
   a main intellectual property (IP) including a first data path and a first control signal path;
   a checker IP including a second control signal path; and
   an error detection circuit configured to
      detect an error of data by performing error correction code (ECC) decoding of output data that is output by the main IP to the error detection circuit through the first data path, and
      detect an error of a control signal based on
         a first signal that is output by the main IP to the error detection circuit through the first control signal path, and
         a second signal that is output by the checker IP to the error detection circuit through the second control signal path.

2. The electronic system of claim 1, wherein the error detection circuit comprises:
   an ECC decoder configured to perform the ECC decoding of the output data to detect the error of data and output a data error detection signal in response to the detection of the error of data; and
   a checker circuit configured to detect the error of the control signal based on the first signal and the second signal and to further output a control signal error detection signal in response to the detection of the error of the control signal.

3. The electronic system of claim 2, further comprising a fault collection circuit configured to receive the data error detection signal from the ECC decoder, receive the control signal error detection signal from the checker circuit, and selectively output a fault detection signal with respect to the electronic system in response to the data error detection signal and the control signal error detection signal.

4. The electronic system of claim 1, wherein the first control signal path is configured to output the first signal based on a third signal that is input to the main IP, and the second control signal path is configured to output the second signal based on a fourth signal which is input to the checker IP and delayed by a particular clock cycle relative to the third signal, and wherein the error detection circuit is configured to detect the error of the control signal by comparing a fifth signal to the second signal, wherein the fifth signal is delayed by the particular clock cycle relative to the first signal.

5. The electronic system of claim 4, further comprising:

a first delay circuit configured to generate the fourth signal by delaying the third signal by the particular clock cycle; and a second delay circuit configured to generate the fifth signal by delaying the first signal by the particular clock cycle.

6. The electronic system of claim 1, further comprising: an ECC encoder configured to generate encoded data by performing ECC encoding on input data, and provide the encoded data to the main IP.

7. The electronic system of claim 6, wherein the encoded data includes the input data and checker data to be generated based on the input data.

8. The electronic system of claim 1, wherein the second control signal path comprises circuit elements that are the same as circuit elements of the first control signal path.

9. The electronic system of claim 1, wherein the checker IP further comprises a second data path generated through boundary optimization, after the first data path is duplicated and then all inputs are tied.

10. The electronic system of claim 9, wherein an input of the second data path and an output of the second data path that is dependent on the input are omitted in the second data path.

11. The electronic system of claim 9, wherein the electronic system is implemented as a system-on-chip, and a circuit area occupied by the second data path on a chip of the system-on-chip is less than a circuit area occupied by the first data path on the chip of the system-on-chip.

12. The electronic system of claim 1, wherein all of the main IP, the checker IP, and the error detection circuit are circuits configured to operate in a one-clock domain.

13. A method of detecting a fault of an electronic system, the electronic system including a first intellectual property (IP) and a second IP, the method comprising:

detecting an error of input data by performing error correction code (ECC) decoding of output data that is output from a first data path of the first IP; and detecting an error of a control signal based on a first signal that is output from a first control signal path of the first IP and a second signal that is output from a second control signal path of the second IP.

14. The method of claim 13, wherein the detecting of the error of the control signal comprises:

generating a third signal by delaying the first signal by a particular clock cycle; and outputting a control signal error detection signal based on comparing the third signal to the second signal.

15. The method of claim 14, further comprising:

outputting the first signal by the first IP through the first control signal path, based on a fourth signal;

generating a fifth signal by delaying the fourth signal by the particular clock cycle; and outputting the second signal by the second IP through the second control signal path, based on the fifth signal.

16. The method of claim 13, further comprising:

generating encoded data by performing ECC encoding of the input data; and outputting the output data by the first IP through the first data path, based on the encoded data.

17. The method of claim 13, wherein the second IP further comprises a second data path generated through boundary optimization, after the first data path is duplicated and then all inputs are tied.

18. The method of claim 17, wherein an input of the second data path and an output of the second data path that is dependent on the input are omitted in the second data path.

19. A system-on-chip, comprising:

an error correction code (ECC) encoder configured to generate encoded data by performing ECC encoding of input data;

a main intellectual property (IP) configured to receive the encoded data and a first control signal and to output an output data through a first data path based on the encoded data and to output a second control signal through a first control signal path based on the first control signal;

a first delay circuit configured to generate a third control signal by delaying the first control signal by a particular clock cycle;

a checker IP configured to output a fourth control signal through a second control signal path based on the third control signal;

an ECC decoder configured to output a data error detection signal by performing ECC decoding of the output data;

a second delay circuit configured to generate a fifth control signal by delaying the second control signal by the particular clock cycle; and a checker circuit configured to detect an error of a control signal by comparing the fourth control signal to the fifth control signal.

20. The system-on-chip of claim 19, further comprising:

a fault collection circuit configured to output a fault detection signal with respect to the system-on-chip in response to the data error detection signal that is received from the ECC decoder and a control signal error detection signal that is received from the checker circuit.

* * * * *